(12) United States Patent
Kataoka et al.

(10) Patent No.: US 7,304,642 B2
(45) Date of Patent: Dec. 4, 2007

(54) ANALYSIS MODEL PRODUCING/ASSISTING APPARATUS

(75) Inventors: Ichiro Kataoka, Chiyoda (JP); Masayuki Hariya, Chiyoda (JP); Makoto Onodera, Tsuchiura (JP); Yoshimitsu Hiro, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 158 days.

(21) Appl. No.: 11/014,900

(22) Filed: Dec. 20, 2004

(65) Prior Publication Data
US 2005/0228804 A1    Oct. 13, 2005

(30) Foreign Application Priority Data
Apr. 6, 2004    (JP) ............................. 2004-112113

(51) Int. Cl.
*G06T 15/00* (2006.01)

(52) U.S. Cl. ................ 345/420; 345/423; 345/428; 703/2; 703/8

(58) Field of Classification Search ................ 345/420, 345/423, 428; 703/1, 2, 8
See application file for complete search history.

(56) References Cited

U.S. PATENT DOCUMENTS

| | | | | |
|---|---|---|---|---|
| 5,731,817 A | * | 3/1998 | Hahs, Jr. et al. ............ | 345/423 |
| 5,870,308 A | * | 2/1999 | Dangelo et al. ............... | 716/18 |
| 6,096,087 A | * | 8/2000 | Weber et al. ................... | 703/8 |
| 6,618,694 B1 | * | 9/2003 | Shibuya et al. ................ | 703/1 |
| 6,633,836 B1 | * | 10/2003 | Yamaura ........................ | 703/2 |
| 2002/0052720 A1 | * | 5/2002 | Nishiura ..................... | 702/189 |

FOREIGN PATENT DOCUMENTS

| | | |
|---|---|---|
| JP | 2002-202997 | 7/2002 |
| JP | P3382934 | 12/2002 |

OTHER PUBLICATIONS

Moore et al., "Recent Advances in MSC/PATRAN Pre-Processing Software Allows Modeling of Complex Automotive Lamp Designs", pp. 1-9; Americas User's Conference 1998.*

* cited by examiner

*Primary Examiner*—Phu K. Nguyen
(74) *Attorney, Agent, or Firm*—McDermott Will & Emery LLP

(57) ABSTRACT

An analysis model producing/assisting apparatus produces a recognition model, approximating surfaces of configuration and ridgelines thereof by planes and lines, from a configuration model showing the configuration. Thereafter, it produces a mapping model through dividing the recognition model into cubic grids, and then produces an analysis model, through mapping grid points of the mapping model onto the configuration model. When producing the recognition model, know-how for producing the analysis model, which gives an influence upon quality of the meshes of the analysis model, is take out from a database, and that know-how for producing the analysis model is applied onto the configuration model.

7 Claims, 5 Drawing Sheets

FIG.3

| ANGLE (θx) | ANGLE (θy) | ANGLE (θz) | ASSIGNED ANGLE (α) | ASSIGNED ANGLE (β) | ASSIGNED ANGLE (γ) |
|---|---|---|---|---|---|
| 10 | | | 0.7 | | |
| 15 | | | 0.65 | | |
| 20 | | | 0.6 | | |
| | | | | | |
| | | | | | |

FIG.4

| $\theta_{ab}$ | $P_{ab}$ |
|---|---|
| 0 | 0.0 |
| 10 | 0.0 |
| 20 | 0.0 |
| ⋮ | ⋮ |
| 90 | 0.0 |
| 110 | 0.2 |
| ⋮ | ⋮ |
| 160 | 0.8 |
| 180 | 1.0 |

ANALYSIS MODEL PRODUCING/ASSISTING APPARATUS

The present application claims priority from Japanese application JP2004-112113 filed on Apr. 6, 2004, the content of which is hereby incorporated by reference into this application.

BACKGROUND OF THE INVENTION

The present invention relates to an apparatus for producing an analysis model and assisting the production thereof, through producing know-how of producing the analysis model, to be accumulated or stored into DB (Database), and/or to be re-used, in particular, when producing the analysis model from configuration model data.

Conventionally, there is already proposed a system for producing and assisting analysis models. For example, in Japanese Patent No. 3,382,934 (Japanese Patent Laying-Open No. 2002-202997 (2002)) is disclosed a system, describing analyzing know-how through HTML at each step of the analyzing steps, wherein the analyzing know-how about an analysis target is ref erred to, thereby obtaining reduction or shortening of analyzing time.

In designing a product, a method comes to be a mainstream, of producing CAD data (i.e., the configuration model data), so as to produce a design drawing (or, a blueprint). Further, through computer simulation (CAE: Computer Aided Engineering), it is possible to produce an analysis model from CAD data, thereby to conduct analysis, such as, structure analysis, fluid analysis, etc., upon a product designed, and hereafter it can be considered that such the analysis by using the CAE comes up to be an item to be studied in the designing.

When producing the analysis model from the CAD data (i.e., the configuration model), it is necessary to make up or determine mesh production and/or boundary conditions; however, in particular, with the know-how, in particular, in relation to the analysis, conventionally, it is very often that only an expert of analysis holds it. Also, in the analysis model produced is included know-how, which is set up by the analysis expert; however, for the purpose of extracting such the know-how by a person other than that analysis expert, it is necessary to have an acknowledge about when or under which condition that know-how can be used, and therefore it is not easy for a person other than the analysis expert to use the analyzing know-how, appropriately.

Also, in the Japanese Patent No. 3,382,934 (Japanese Patent Laying-Open No. 2002-202997 (2002)) is disclosed an effect that general-purpose operation portions can be achieved through general-purpose work steps of a navigation format, while the portions of the analyzing know-how can be described freely by a used; however, there is not paid sufficient consideration upon the detailed description of such the analyzing know-how, in particular, when producing an analysis model of the mesh form, finally, during intermediate steps of analyzing.

BRIEF SUMMARY OF THE INVENTION

An object according to the present invention is to provide a producing/assisting apparatus of an analysis model, for producing necessary know-how of the analysis model, for accumulating or storing it into DB (Database), and thereby enabling re-using thereof, in particular, when producing the analysis model from configuration model data.

For accomplishing the object mentioned above, according to the present invention, there is provided an analysis model producing/assisting apparatus, comprising: a means for inputting a configuration model; a means for producing a recognition model, approximating surfaces of said configuration model and ridgelines thereof by planes and lines, respectively; a means for producing a mapping model of dividing said recognition model into cubic grids; and a means for producing an analysis model, forming hexahedron meshes through mapping grid points of the cubes of said mapping model onto said configuration model, wherein know-how for producing the analysis model, which gives an influence upon quality of said meshes of said analysis model, is take out from a database, and the taken-out know-how for producing the analysis model is applied onto said configuration model, thereby producing said recognition model.

According to the present invention, in the apparatus as mentioned above, the know-how for producing the analysis model is based on rule strength, as being a parameter for configuration recognition when producing said recognition model from said configuration model. And, said rule strength is changed through conducting an evaluation upon the mesh quality of said analysis model.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein:

FIGS. 3 and 4 are views for explaining rules of know-how for producing an analysis model.

DETAILED DESCRIPTION OF THE INVENTION

Figure 1:
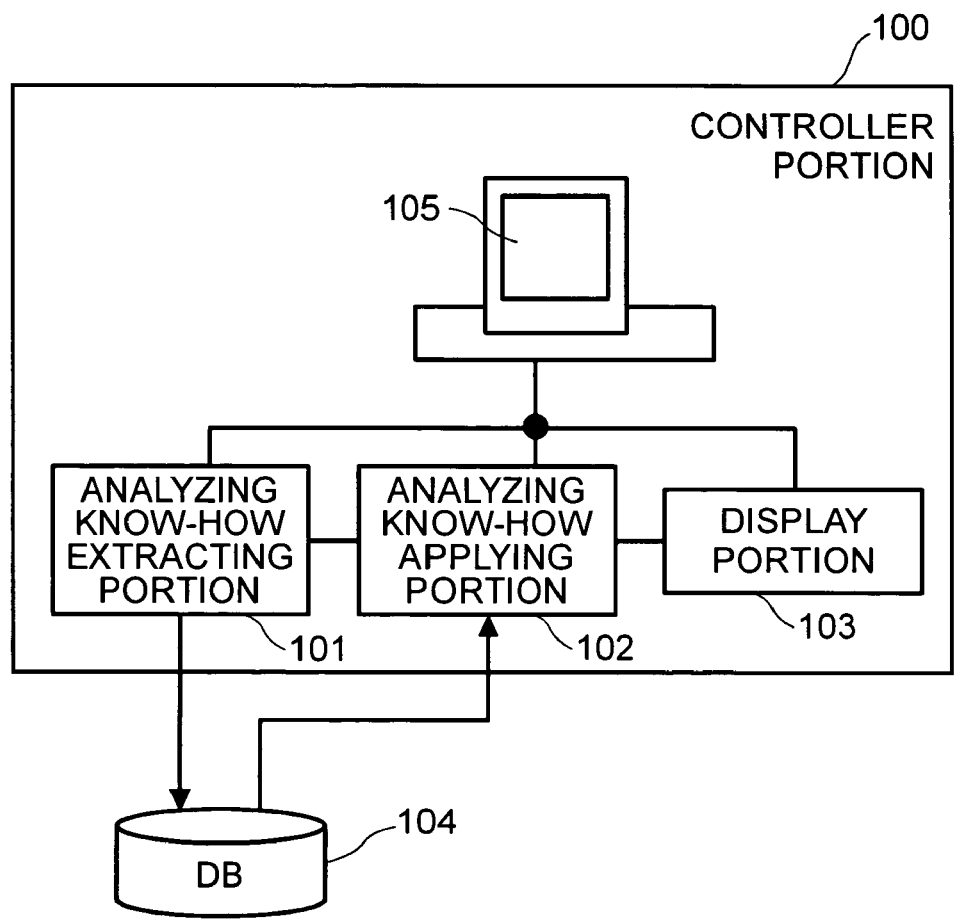
FIG. 1 is a block diagram for showing the entire structure of an analysis model producing/assisting apparatus, according to an embodiment of the present invention.
Figure 2:
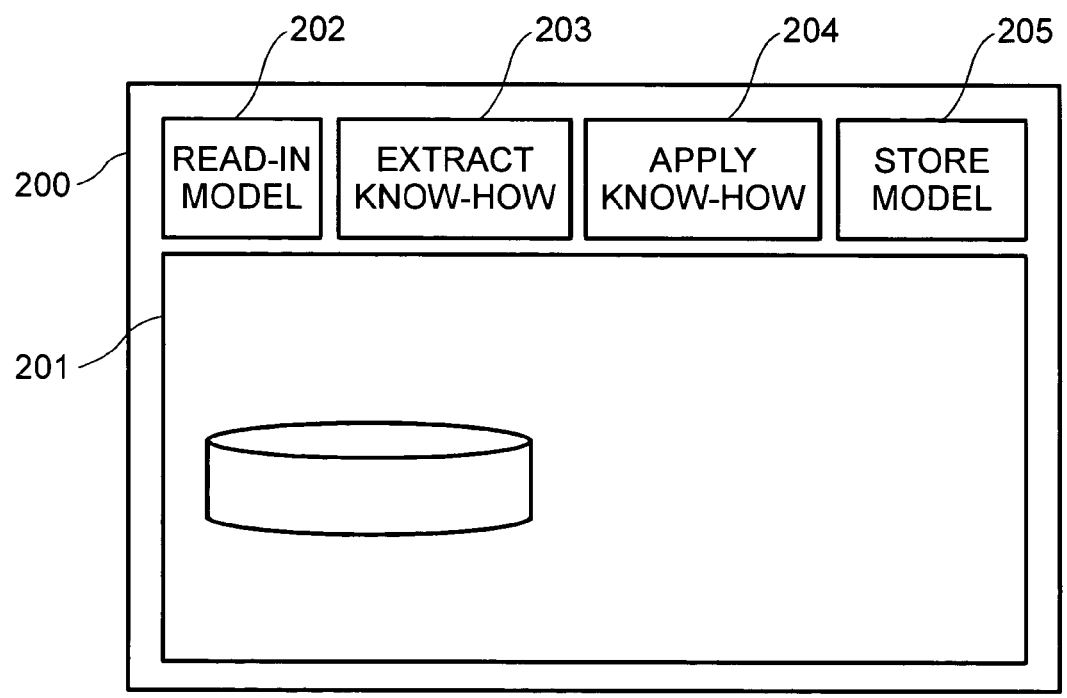
FIGS. 2 is a view for showing an example of a display screen.

Hereinafter, embodiments according to the present invention will be fully explained by referring to the attached drawings. FIG. 1 is a block diagram for showing the entire structure of an embodiment of an analysis model producing/assisting apparatus, according to the present invention. FIG. 2 is a view for showing an example of a display screen in the present embodiment. FIG. 3 is a view for showing a rule 1 of the know-how for producing an analysis model, when producing a recognition model from configuration model data, in the present embodiment. FIG. 4 is a view for showing a rule 2 of the know-how for producing an analysis model, when producing a recognition model from configuration model data, in the present embodiment. And, FIG. 5 is an explanatory view for showing detailed structure of the analysis model producing/assisting apparatus, according to the embodiment of the present invention.

In FIG. 1, the analysis model producing/assisting apparatus 100 comprises: an analyzing know-how extracting portion 101; an analyzing know-how applying portion 102; a display portion 103; and a controller portion 105. A database DB 104 is connected with the analyzing know-how extracting portion 101 and the analyzing know-how applying portion 102, and it is illustrated to be an external apparatus of the analysis model producing/assisting apparatus 100, but it may be built within the analysis model producing/assisting apparatus 100 in the structure thereof.

Figure 5:
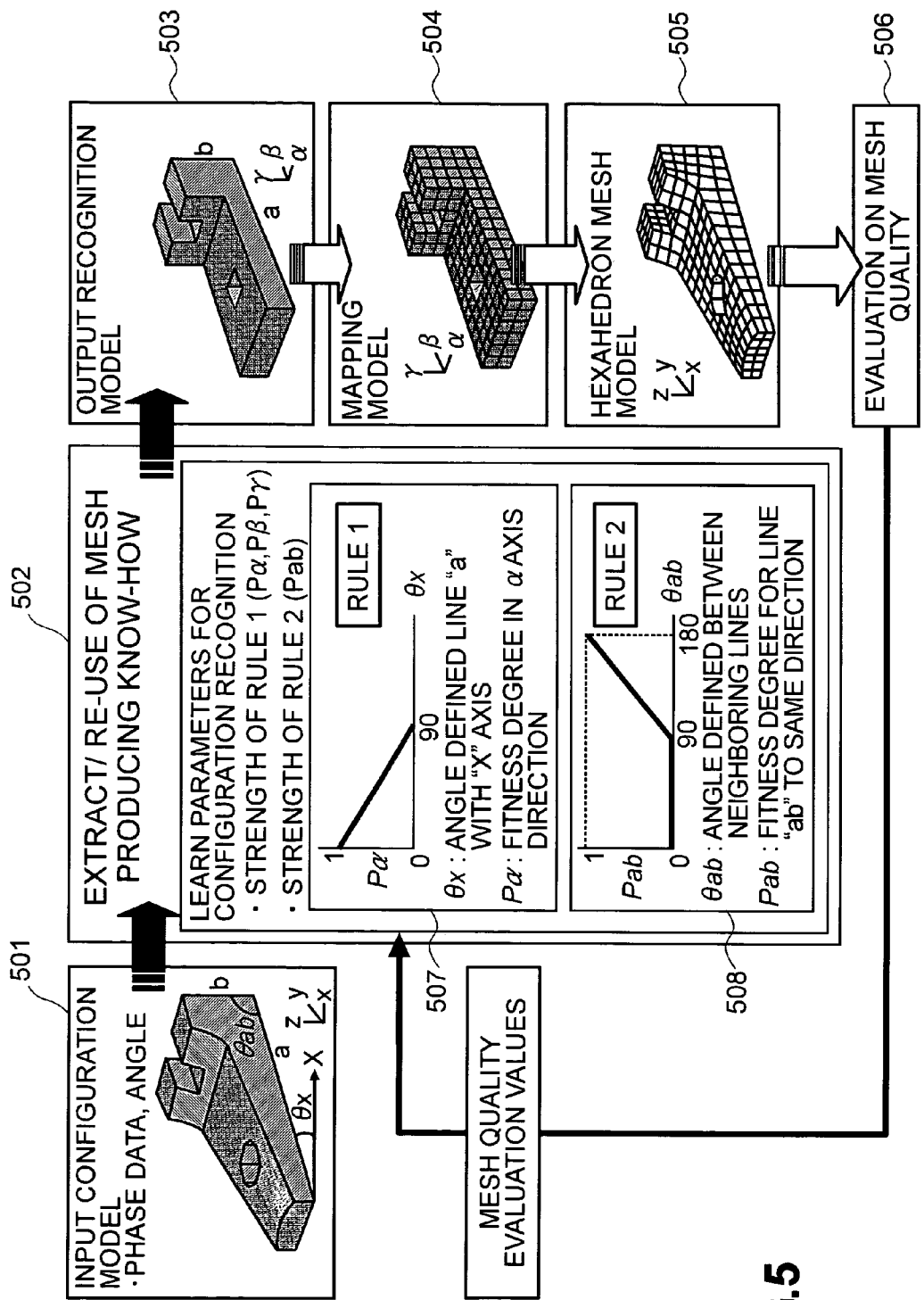
FIG. 5 is a view for explaining a producing/assisting method for the analysis model.

The analyzing know-how extracting portion 101 is provided for taking out the know-how when producing an analysis model, such as, a mesh for use of analyzing (i.e., extracting), and also for learning thereof (in more details thereof, taking out a rule characteristic value shown in FIG. 5); i.e., it extracts analysis model producing know-how, in which manner the mesh is produced, or the like, with respect to the model, which was already divided by the mesh, thereby to be stored within the database (DB). Also, in the analyzing know-how applying portion 102, a rule strength, which is extracted (taken out) from the analyzing know-how extracting portion, is applied onto a configuration model. It is applied onto a new configuration data, with using an analysis model producing know-how (i.e., the analyzing know-how), which is obtained within the analyzing know-how extracting portion and stored within the DB. When producing an analysis model from the new configuration data, the rule strength is applied, upon which a quality evaluation of the analysis model is reflected. On the display portion, a screen is displayed for conducting the processing in an interactive manner. A user is able to read the configuration data while observing the display portion 103, in the interactive manner, thereby applying the analyzing know-how and/or reserving the analyzing know-how, etc. The controller portion 105 controls the analyzing know-how extracting portion 101, the analyzing know-how applying portion 102, and the display portion 103.

FIG. 2 shows a screen on the display portion 103 of the analysis model producing/assisting apparatus 100, which is provided for the user. On the screen of the display portion, the user is able to read the configuration data, to extract the analyzing know-how, to reserve the analysis model. When pushing down a know-how extract button for use in analyzing on the screen, the user can take out the analyzing know-how from the database, upon basis of the configuration model that is read into. Also, when the user pushes down a know-how apply button for use of analyzing, then the analysis model is produced, by applying the rule strength (i.e., an example of numeration of the analyzing know-how, which is indicated as the characteristic value), obtained upon basis of the analyzing know-how and being classified into each of the fields of products, to which the configuration data belongs, onto the configuration data which is read in.

For the analysis model, which is produced through application of the analyzing know-how thereupon, it is also possible to determine on whether the quality of the mesh is good or not, by making an evaluation thereupon. In a case when the quality of the mesh is not good, then "REVISE ANALYSIS MODEL?" is displayed on the screen, and if "YES" is selected, the rule strength is revised, thereby re-produce the analysis model upon the basis of the rule strength revised, again, from the configuration model. Onto the analysis model produced, evaluations of the mesh quality (on an aspect ratio, a stretch, etc.) are made, and the calculation is repeated up to when coming to the value that the user desires. In this manner, with the analysis model producing/assisting apparatus according to the present embodiment, it is possible to achieve the processing while continuing dialog between the user, in the interactive manner.

FIGS. 3 and 4 show example of the analyzing know-how stored within the DB. They are stored in the form of a table of lines and directions of axes assigned to angles of the lines. This data is extracted from the analysis model within the analyzing know-how data extracting portion, then there is no necessity of being registered by the user, newly. Within the DB, the analyzing know-how is stored under the condition of being classified into each of the products. Within the DB, other than the lines and the angels between the lines, it is also possible to store a rule for determining the analysis model, in the form of the know-how, in relation with the parameters making up the configuration data.

FIG. 5 shows the process up to when producing the analysis model (i.e., a hexahedron mesh model) from the configuration data. Explaining about an outlook of the present embodiment of the analysis model producing/assisting apparatus according to the present invention, first the apparatus reads the configuration model data (i.e., CAD data) 501 therein, as an input thereof (for example, an angle defined between the line "a" and an "X" axis, an angle defined between the line "a" and the line "b", a length of the line "a", and a length of the line "b"), and extracts and apples the analyzing know-how onto this configuration model 501, thereby producing a recognition model 503 (i.e., conversion is made for assigning the axes "X", "Y" and "Z" to the axes "α", "β" and "γ", and further conversion is made on the angles defined by the lines, thereby to produce the recognition model).

In this manner, it is one of the features according to the present invention, to produce the recognition model 503, by applying the analyzing know-how 502 upon the configuration model 501. Next, the hexahedron mesh is produced for this recognition model 503, thereby making up a mapping model 504. Following thereto, upon the basis of the mapping model 504 and the configuration model 501, the hexahedron mesh model (i.e., the analysis model) 505 is produced, and a structure analysis and/or a fluid analysis are/is achieved, targeting upon this analysis model 505.

And, upon the analysis model 505, which is produced in this manner, with applying the analyzing know-how 502, an evaluation 506 is conducted, by using the aspect ratio and the stretch of each element (by a unit of the hexahedron), as being an index for mesh quality. Comparing an evaluation result to a target value, and a result obtained through the comparison is reflected upon the strength of a rule 1 and a rule 21, being examples of numeration of the analyzing know-how. Upon basis of this reflected rule strength, the recognition model, the mapping model and the analysis model are produced, through applying the analyzing know-how upon the configuration model, again, thereby executing a re-evaluation on the mesh quality, again. It is also one of the features according to the present invention to increase the evaluation on the mesh quality, through circulating the processes in this manner. However, as one of the evaluations upon the mesh quality can be listed up a degree of deforming the hexahedron shape (distortion), where deviation is caused on the element, as being an unit of the hexahedron mesh model produced, from a regular hexahedron or a rectangular hexahedron in the shape thereof.

Herein, explanation will be given about production of the recognition model, and when producing the recognition model, inputting is made on parameter values, which are owned by data of the configuration model, such as, lines and angle between the lines, a number of division, for example, so as to apply the strength of rules thereupon. The lines and the angle of between the lines indicate a line, which makes up the configuration model, and the angle therebetween, and depending upon a magnitude of this angle, an axis is determined, being assigned to the line of the recognition model. The recognition model is produced corresponding to the assigned axes, which are determined.

Herein, explanation will be made about the embodiment of the present invention, in more details thereof, by referring to an example of the structure shown in FIG. 5. The present embodiment produces the mapping model from the recognition model, being an equivalence of the configuration model, upon basis of the configuration model, and then the hexahedron mesh model (i.e., the analysis model) is produced from the mapping model through the reverse conversation thereof, wherein first, as an input about the configuration model and the division information are inputted the configuration model of a mesh producing target and the target element size of the hexahedron element to be produced. Next, about production of the recognition model, the recognition model is produced, wherein the surfaces and the ridgelines thereof, being equal to in the phase and building up the surfaces of the configuration model, are approximated with planes and lines, respectively. Following thereto, about producing the mapping model, the number of dividing the ridgeline is determined from the target element sizes, and then the mapping model is produced, in which the recognition model is divided into cubic grids. Next, about production of the hexahedron mesh model (i.e., the analysis model), grid points of the cubes of the mapping model are mapped onto the configuration model, thereby producing the hexahedron elements corresponding to the cubes of the mapping model within the configuration model.

With such the algorithm for producing the hexahedron mesh as was mentioned above, since it is based upon the mapping method of mapping the rectangular grid onto the configuration, therefore it is possible to produce the hexahedron meshes which are regularly positioned. It is also possible to produce the recognition model, approximating to the configuration model at high accuracy. With this, it is possible to produce the hexahedron elements being less deformed in the configuration when mapping the cubes of the mapping model onto the configuration.

And, explanation will be given about the producing method of the recognition model from the configuration model, as one of the features according to the present invention, wherein the recognition model is an approximation model, in which the surfaces and the ridgelines thereof, being equal to in the phase and building up the surfaces of the configuration model, are approximated with planes and lines, respectively. For this reason, while assigning each of the ridgelines of the configuration model to any one of the directions of three (3) coordinate axes (P$\alpha$, P$\beta$, P$\gamma$) crossing at right angles within a mapping space, and further obtaining the length of the each ridgeline within the mapping space, it is possible determine the recognition model. The algorithm in processing the assignment of direction for the configuration model is as will be mentioned below.

First of all, (1) calculation is made on $\theta x$, $\theta y$ and $\theta z$, which build up a line "a". (2) Degrees of fitness P$\alpha$a, P$\beta$a and P$\gamma$a are calculated, respectively, in accordance with the corresponding rules $\theta x$-P$\alpha$, $\theta y$-P$\beta$ and $\theta z$-P$\gamma$. (3) The degree of fitness Pab is obtained upon when assigning the lines "a" and "b" neighboring to each other into the same direction within the mapping space. Herein, $\theta ab$ is an angle defined by two (2) lines neighboring to each other, and for example, in a case where the angle $\theta ab$ defined by the lines "a" and "b" is 135°, then in accordance with the corresponding rule of $\theta ab$–Pab, Pab can be calculated out to be 0.5. (4) With using Pab, amendments are made on the fitness degrees P$\alpha$a, P$\beta$a and P$\gamma$a to be assigned to the respective axes. (5) Selection is made on one, which has the largest value thereof among the fitness degrees P$\alpha$a, P$\beta$a and P$\gamma$a amended, thereby to be the axis to be assigned to. For example, when P$\alpha$a=0.2, P$\beta$a=0.8 and P$\gamma$a=0.3, then the line "a" is assigned into the direction the $\beta$ axis.

In this manner, there are provided a rule 1 (507) and a rule 2 (508), when producing the recognition model from the configuration model, as an example of the know-how for analyzing, and then, for example, the line "a" indicated on the recognition model 503 is produced corresponding to the angle defined by the line "a" to the X axis, in accordance with the rule 1 indicative of the fitting degree into the direction of the a axis (i.e., in the example shown in the figure, the line "a" is assigned into the a axis), while the line "b" indicated on the recognition model 503 is produced corresponding to the angle $\theta ab$ defined by the line "b" neighboring to the line "a", in accordance with the rule 2 indicative of the fitting degree when the lines "a" and "b" are in the same direction (i.e., in the example shown in the figure, the line "b" is not in the same direction of the line "a", and then a line perpendicular thereto is produced). And, finally, the analysis model 505 is produced, and an evaluation of the mesh quality is made upon that analysis model 505 produced. Then, the rule 1 and the rule 2 are revised on the characteristic values thereof (i.e., the characteristic curves shown in the figure), thereby obtaining the mesh quality much better than that.

The know-how 502 for analyzing, which is improved on the mesh quality thereof, in the manner as was mentioned above, will be applied onto a new configuration model, and thereby the analysis model 505 is produced through the recognition model 503. In this instance, as such the new configuration models, typically, incase of targeting the configuration model, which is deformed a little bit, such as, when the line "a" on the configuration model shown in FIG. 5 comes to be a little bit long or short, or when the angle $\theta ab$ is a little bit large or small, for example.

Also, when applying the know-how for analyzing (i.e., the mesh producing know-how 502) stored within the database DB 104, determination is made on if there is an analogue configuration or not, onto which the analyzing know-how should be applied to, upon the new configuration data, in particular, when producing the recognition model as to be a pre-stage model of the analysis model (i.e., the hexahedron mesh model). For determination of the new configuration, the recognition model is produced from the configuration model with using the rule, and it is determined on if there is a similar patter or not, within the recognition model.

Herein, assuming that a target is made on a saddle portion being horseshoe-like in the cross-section, having curves on both the inner periphery and the outer periphery thereof, for example, for the recognition model, it is common to be "Π" type when those curves on the inner and outer peripheries are converted into on the coordinate axes of $\alpha$, $\beta$, and $\gamma$. In the case where there is the "Π" type within the recognition model, it is determined on whether this pattern should be converted into an "I" type or not (through changing the rules 1 and 2), for fitting to an analysis condition. Thus, the know-how for analyzing stored within the DB is presented in such the form, that an axis assignment operation can be done for conversing into the "I" type, in the case where there is the patter of the "Π" type therein.

Naturally, it is right in the processing that the recognition model is converted into the "Π" type, by applying the rules from the configuration model. However, when making the analysis with using the analysis model to be a target, there may be cases where a request is made for changing mesh distribution, depending upon the situation, such as, when conducting the structure analysis or the fluid analysis, for example. Thus, when conducting the fluid analysis after producing the mesh for the fluid analysis through the conversion of the recognition model into the "I" type, there can be a case where the analyzing processes can be conducted, appropriately, if applying that know-how for analyzing therein.

For example, when conducting the structure analysis upon the saddle portion saddle portion being horseshoe-like in the cross-section by curves, it is appropriate to use the recognition model of the "II" type, however when conducting the fluid analysis upon the outer surface of the saddle portion, there may be a case where the analyzing processes can be made easily, by applying the recognition model of "I" type, comparing to that of applying "n" type (i.e., being small on distortion of the configuration for each the mesh element). Determination is made depending on a field, to which the product belongs, as well as, the contents of analysis, which kind of analyzing mesh should be applied thereto. Further, depending on a field, to which the product belongs, as well as, the contents of analysis, it is determined which kind of the recognition model should be produced, and then the recognition model is produced, by applying the know-how for producing the analysis model.

As was explained in the above, the 3-dimentional CAD model (i.e., the configuration model) is utilized, according to the present invention, thereby building up a system for producing the analysis model data from the configuration model. The analysis model producing/assisting apparatus, according to the present invention, enables read-in and reservation of the configuration data/analysis model data, and produces the know-how for analyzing from the analyzing model data which is read in.

The know-how for analyzing is for indicating a manner, in which method the meshes should be produced, in relation to the elements, which build up the configuration model, (i.e., the angle between lines, and the length of the line, etc.) Thus, for example, it indicates a relationship, such as, that it is better to deliver the assignment direction of the line to the X axis in the production of the analysis model, when there is the configuration data showing a certain value in the angle between the lines.

The know-how for producing the analysis model is stored in the DB, and then the analysis model is produced, by applying the know-how stored into the DB, when the CAD data is read in, newly. Thus, with utilizing the know-how stored, the analysis model is produced. After producing the analysis model, the evaluation is made upon the model, and if a value does not reach to a certain value, the know-how is applied under the condition of being revised a little bit on the rule strength thereof, thereby producing the analysis model.

According to the present invention, it is possible to take out the know-how, in particular, in relation to the production of the analysis model, being unique for each product, so as to apply the know-how extracted onto the target product, automatically, thereby enabling even a beginner to produce the analysis model with good quality.

Also, with utilizing the know-how for producing the analysis model, it is possible to reduce or shorten the time, being necessary for the beginner to produce the analysis model, conventionally. Thus, storing the know-how for producing the analysis model, which is produced by an analyzing specialist, into the database DB, it is possible to reserve the know-how, thereby enabling to succeed the knowledge. Also, if being on the similar field of the products, it is possible develop the know-how for producing the analysis model into the other products, thereby enabling to reduce the labor necessary for producing the analysis model.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. An analysis model producing/assisting apparatus, comprising:
   a means for inputting a configuration model;
   a means for producing a recognition model, approximating surfaces of said configuration model and ridgelines thereof by planes and lines, respectively;
   a means for producing a mapping model of dividing said recognition model into cubic grids; and
   a means for producing an analysis model, forming hexahedron meshes through mapping grid points of the cubes of said mapping model onto said configuration model, wherein know-how for producing the analysis model, which gives an influence upon quality of said meshes of said analysis model, is stored, in a database in the form of a table of lines and directions of axes assigned to angles of the lines, and wherein the know-how is taken out from the database, and the taken-out know-how for producing the analysis model is applied to said configuration model, thereby producing said recognition model.

2. The analysis model producing/assisting apparatus, as described in the claim 1, wherein said know-how for producing the analysis model is established from a rule strength, as being a parameter for configuration recognition when producing said recognition model from said configuration model.

3. The analysis model producing/assisting apparatus, as described in the claim 2, wherein said rule strength is changed through conducting an evaluation upon the mesh quality of said analysis model.

4. The analysis model producing/assisting apparatus, as described in the claim 1, wherein said know-how for producing the analysis model is stored into said database, being classified for each of products corresponding to said configuration model.

5. The analysis model producing/assisting apparatus, as described in the claim 4, wherein it is determined on if there is a similar configuration or not, to a new configuration model, so as to select a specific know-how for producing the analysis model, when applying said know-how for producing the analysis model thereon.

6. The analysis model producing/assisting apparatus, as described in the claim 4, wherein a specific know-how for producing the analysis model is selected upon basis of a condition of analysis, such as, structure analysis or fluid analysis, upon conducting analysis with applying the analysis model, when applying said know-how for producing the analysis model thereon.

7. The analysis model producing/assisting apparatus, as described in claim 1, wherein the taken-out know-how is stored in said database, a result of which is learning, wherein said learning is stored in said database.

* * * * *